United States Patent

Fu et al.

[11] Patent Number: 6,069,074
[45] Date of Patent: May 30, 2000

[54] METHOD OF FORMING CONDUCTOR SHIELDING TO PREVENT ARCING EFFECT DURING CONTACT IMPLANT PROCESS

[75] Inventors: Chiang Fu; Jun-Yen Huang, both of Hsin-Chu; Ming Chu King, Taichung; Chien-Chen Chen, Hsin-Chu, all of Taiwan

[73] Assignee: Taiwan Semiconductor Manufacturing Company, Hsin-Chu, Taiwan

[21] Appl. No.: 09/236,490

[22] Filed: Jan. 25, 1999

[51] Int. Cl.[7] .................................................. H01L 21/44
[52] U.S. Cl. ............................................. 438/653; 438/643
[58] Field of Search .................................... 438/523, 627, 438/643, 659, 637, 672, 675

[56] References Cited

U.S. PATENT DOCUMENTS

| 5,087,322 | 2/1992 | Lillienfeld et al. | 438/523 |
|---|---|---|---|
| 5,654,234 | 8/1997 | Shih et al. | 438/643 |
| 5,665,629 | 9/1997 | Chen et al. | 438/384 |
| 5,670,417 | 9/1997 | Lambson et al. | 438/637 |
| 5,723,893 | 3/1998 | Yu et al. | 257/413 |
| 5,747,379 | 5/1998 | Huang et al. | 438/586 |
| 5,915,190 | 7/1999 | Pirkle | 438/424 |
| 5,940,726 | 8/1999 | Yu | 438/597 |

*Primary Examiner*—David Nelms
*Assistant Examiner*—Dung A Le
*Attorney, Agent, or Firm*—George O. Saile; Stephen B. Ackerman; Rosemary L.S. Pike

[57] ABSTRACT

A method preventing the arcing effect during contact implantation by employing a conductive shielding film within the contact opening in the fabrication of an integrated circuit is described. A dielectric layer is provided overlying a semiconductor substrate of a wafer. The dielectric layer is etched into to provide a contact opening through the dielectric layer to the semiconductor substrate. A conducting layer is deposited overlying the dielectric layer and within the contact opening. A photoresist mask is formed over the conducting layer having an opening above the contact opening. The wafer is placed in an ion implantation chamber wherein the wafer is held by means of an electrostatic chuck. Ions are implanted into the semiconductor substrate through the conducting layer not covered by the photoresist mask wherein some of the ions are trapped on photoresist mask and wherein the conducting layer conducts the trapped ions throughout the wafer thereby preventing charge damage to the dielectric layer.

19 Claims, 3 Drawing Sheets

METHOD OF FORMING CONDUCTOR SHIELDING TO PREVENT ARCING EFFECT DURING CONTACT IMPLANT PROCESS

BACKGROUND OF THE INVENTION (1) Field of the Invention

The invention relates to the fabrication of integrated circuit devices, and more particularly, to a method of preventing the arcing effect during contact implant by using a conductive shield within the contact opening in the fabrication of integrated circuits.

(2) Description of the Prior Art

In the manufacture of semiconductor devices, it is necessary in many processes to perform an ion implantation within a contact opening. For example, this may be used in fabricating CMOS logic circuits. During contact implantation, the wafer must be held within the implantation chamber. Usually, a mechanical chuck holds the wafer in place. Particle contamination and implant shadowing at the edge of the wafer have been found to be disadvantages of a mechanical chuck. To avoid these damages, an electrostatic chuck has been used to increase the useful wafer area, eliminate implant shadowing, and reduce particle contamination. To maintain enough holding force, a six-phase AC square wave with 1000 volts is applied on six sectors so that at least four sectors are kept at full voltage.

A ring-type electrostatic discharge defect has been observed after contact implantation. This defect has been found to be attributable to the electrostatic chuck used to hold the wafer during contact implantation. The yield loss is about 40% due to this defect. It has been determined that the damage is due to the non-uniformly distributed electric field around the wafer which causes an non-uniformly distributed charge accumulation on the photoresist surface leading to the electrostatic discharge damage, or the so-called arcing effect. The electrostatic discharge damage can be eliminated by replacing the electrostatic chuck with a mechanical chuck. However, the cost is a loss of the advantages of the electrostatic chuck. It is desired to find a way to prevent electrostatic discharge damage while using an electrostatic chuck to hold a wafer during contact implantation.

U.S. Pat. No. 5,665,629 to Chen et al teaches forming a high resistance film such as SiN, $SiO_2$, or $TiO_2$ within a contact opening and then filling the opening with a metal plug. Ti/TiN has often been used in the art as a barrier layer under a metal plug, such as in U.S. Pat. No. 5,654,234 to Shih et al, for example. Titanium has also been used as a silicide layer over gate electrodes and source/drain regions, such as in U.S. Pat. No. 5,723,893 to Yu et al, for example.

SUMMARY OF THE INVENTION

Accordingly, a principal object of the present invention is to provide an effective and very manufacturable method of preventing the arcing effect during contact implantation in the fabrication of an integrated circuit.

A further object of the invention is to provide a method of preventing the arcing effect during contact implantation while using an electrostatic chuck to hold the wafer in the fabrication of an integrated circuit.

Yet another object is to provide a method of preventing the arcing effect during contact implantation by employing a conductive shielding film within the contact opening in the fabrication of an integrated circuit.

Yet another object is to provide a method of preventing the arcing effect during contact implantation while using an electrostatic chuck to hold the wafer by employing a conductive shielding film within the contact opening in the fabrication of an integrated circuit.

In accordance with the objects of this invention a method of preventing the arcing effect during contact implantation by employing a conductive shielding film within the contact opening in the fabrication of an integrated circuit is achieved. A dielectric layer is provided overlying a semiconductor substrate of a wafer. The dielectric layer is etched into to provide a contact opening through the dielectric layer to the semiconductor substrate. A conducting layer is deposited overlying the dielectric layer and within the contact opening. A photoresist mask is formed over the conducting layer having an opening above the contact opening. The wafer is placed in an ion implantation chamber wherein the wafer is held by means of an electrostatic chuck. Ions are implanted into the semiconductor substrate through the conducting layer not covered by the photoresist mask wherein some of the ions are trapped on the photoresist mask and wherein the conducting layer conducts the trapped ions throughout the wafer thereby preventing charge damage to the dielectric layer.

BRIEF DESCRIPTION OF THE DRAWINGS

In the accompanying drawings forming a material part of this description, there is shown.

DESCRIPTION OF THE PREFERRED EMBODIMENTS

Figure 1:
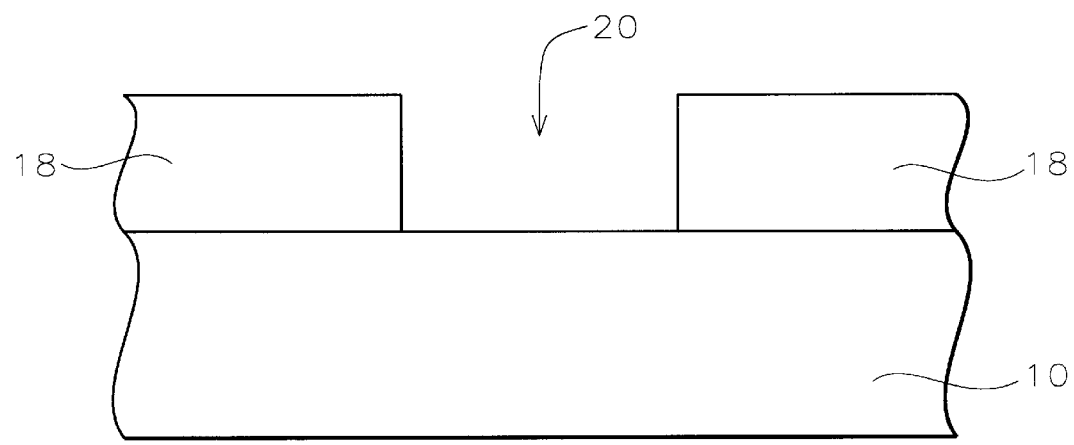
FIGS. 1 through 5 schematically illustrate in cross-sectional representation a preferred embodiment of the present invention.

The electrostatic discharge damage due to the arcing effect has been observed to be a large hole in the interlevel dielectric (ILD) layer. The severe damage to the ILD and underlayer structure was identified as discharge damage caused by the electrostatic chuck used to hold the wafer in place during contact implantation. Reducing the beam current of the electrostatic chuck will lower the defect count, but cannot eliminate the defect.

The electric field on the wafer edge is different from the electric field at the center of the wafer. It is suspected that the electric field at the wafer edge is not adequately shielded and can influence the dosage of implanted ions leading to a higher probability of electrostatic damage at the wafer edge.

The inventors devised a loop test to verify the cause of the damage. As a result of the testing, a number of determinations were made:

1) Wafers held by a mechanical chuck had no damage. All other tests were performed using the electrostatic chuck.
2) Wafers on which an ion implantation was performed before the ILD deposition had no electrostatic damage. There is a larger area for ion bombardment and a higher current leakage path in this case.
3) It was found that defects are more severe for a N+—P junction than for a N+—P— junction. The leakage current path and the breakdown voltage are larger for the N+—P— junction than for the N+—P junction. Damage is prevented where the leakage current path is larger and the ion charges are able to be conducted to the ground instead of accumulating.

4) A lower implant dosage avoided electrostatic damage.
5) A contact implantation done without a photoresist deposition had no observed defect. The ILD layer formed before the contact implant is not conductive. The ions implanted on the oxide layer surrounding the contact hole will not be able to move. Where photoresist is present, ions implanted onto the photoresist surface also will not be able to move. However, the conductivity of organic photoresist is better than the conductivity of oxide. Ions trapped on the sidewalls of the photoresist in the contact openings will be pulled down during the phase change of the electrostatic chuck voltage and by gravity. When the accumulated charges on the photoresist go over a certain threshold and experience a strong electric field during phase change of the electrostatic chuck, arcing could occur.
6) A wafer having a titanium/titanium nitride layer deposited within the contact opening before the contact implantation had no defects. The charges could be conducted very rapidly by the Ti/TiN layer. The charges do not accumulate, but are shared by the whole wafer resulting in no electrostatic discharge damage.

Accordingly, the inventors have determined that a simple and effective method for avoiding electrostatic damage during contact implantation using an electrostatic chuck is to deposit a conductive layer within the contact opening before implantation. The details of the present invention will be described with reference to FIGS. 1–5.

Referring now more particularly to FIG. 1, there is shown a highly simplified illustration of a portion of a partially completed integrated circuit. The semiconductor substrate 10 is preferably composed of silicon having a (100) crystallographic orientation. A dielectric layer 18 is deposited over the surface of the substrate. The dielectric layer may be silicon oxide or borophospho-TEOS (BPTEOS), or the like, and may have a thickness of between about 8000 and 12,000 Angstroms. Semiconductor devices structures such as gate electrodes and source and drain regions, not shown, may be formed in and on the semiconductor substrate and covered by the dielectric layer 18. The dielectric layer 18 is etched to form a contact opening 20 to the substrate 10.

Figure 2:
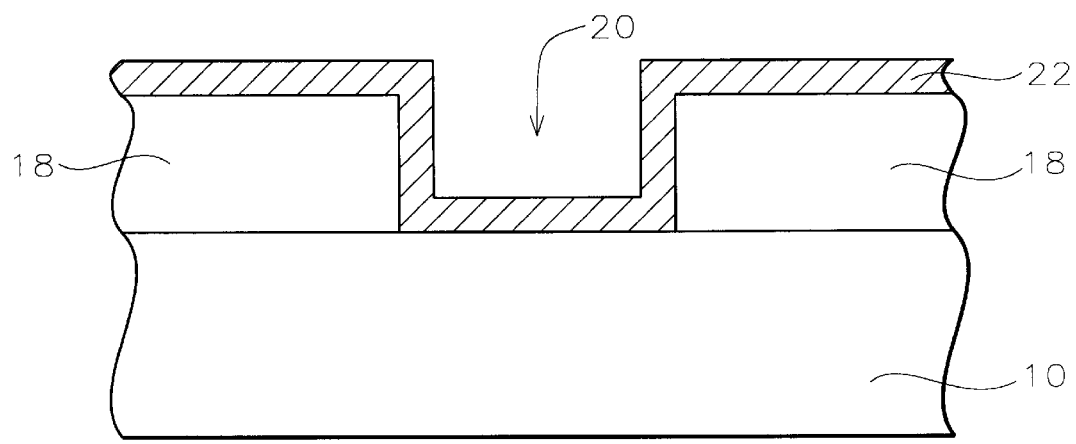

Referring now to FIG. 2, a conductive layer 22 is deposited over the surface of the dielectric layer and within the contact opening. The conductive layer may comprise titanium or a dual layer of titanium/titanium nitride and has a thickness of between about 300 and 2000 Angstroms.

Figure 3:
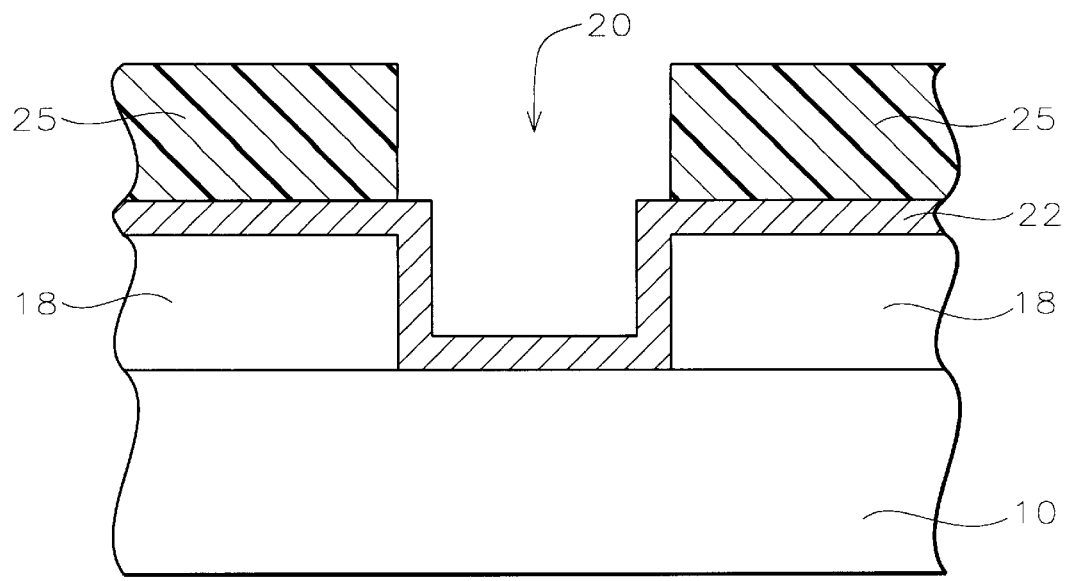

Next, a layer of photoresist is coated onto the surface of the substrate and patterned to form the contact implant mask 25, shown in FIG. 3.

Figure 4:
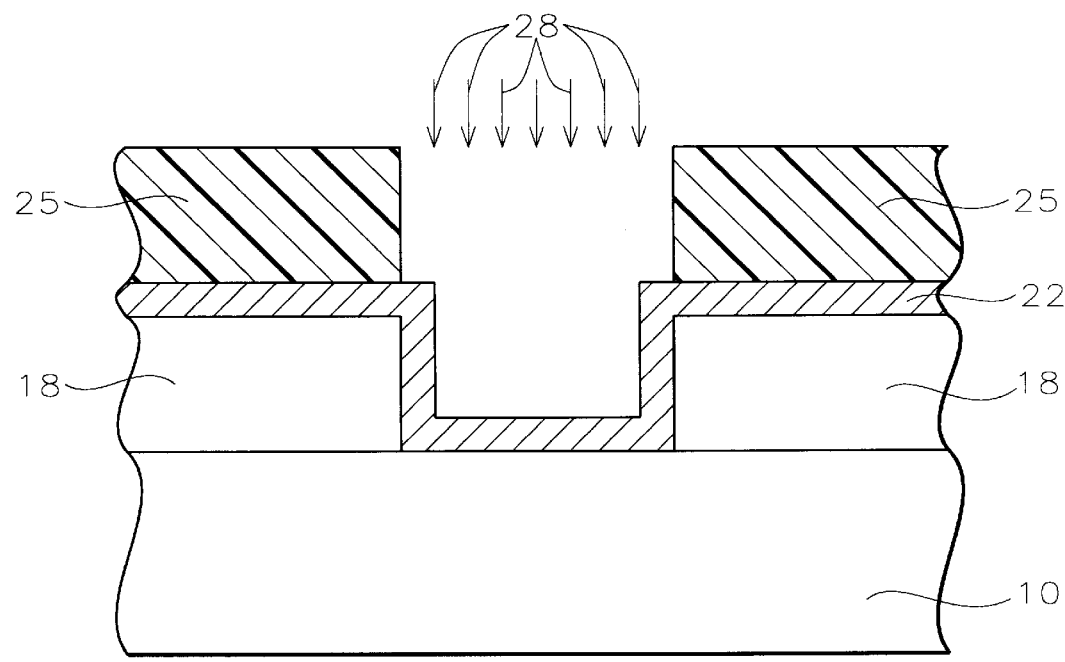

Ions 28 are implanted into the contact opening not covered by the photoresist mask 25, as shown in FIG. 4. The conductive layer 22 rapidly conducts the charges throughout the wafer, preventing charge accumulation and thereby preventing electrostatic damage. Because of the presence of the conductive layer, the ions must be implanted at a higher energy than usual to penetrate this layer. For example, ions are typically implanted at an energy of between about 60 to 90 KeV. In the process of the present invention, the ions are implanted at an energy of between about 100 and 150 KeV.

Figure 5:
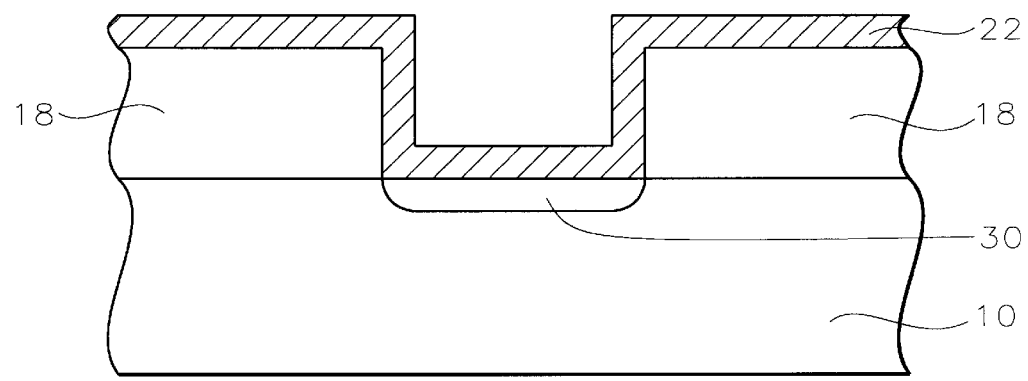

The results of the contact implantation are shown in FIG. 5. Implanted region 30 has been formed. The photoresist mask 25 is removed. The conductive layer 22 may be removed at this time, or may remain within the contact opening as a barrier layer for subsequent metal deposition, for example.

Figure 6:
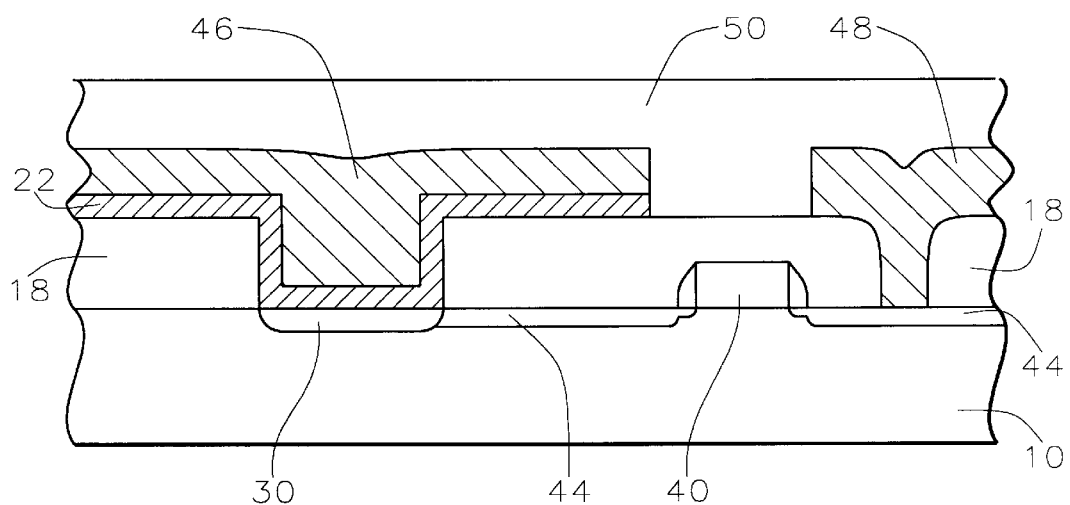
FIG. 6 schematically illustrates in cross-sectional representation a completed integrated circuit device fabricated according to a preferred embodiment of the present invention.

FIG. 6 illustrates an example of a portion of an integrated circuit device fabricated by the process of the present invention. Gate electrode 40 and source and drain regions 44 have been formed in and on the semiconductor substrate 10 and covered with dielectric layer 18. The contact implant 30 has been made through the barrier layer 22 of the invention. An opening has also been made to one of the source/drain regions 44. Both openings have been filled with metal layer 46 which has been patterned and then passivated with layer 50. FIG. 6 has been presented as an illustration of one possible integrated circuit device that can be made according to the process of the invention. Many other applications of the invention may be realized by those skilled in the art. The process of the present invention can be used to prevent the arcing effect in any kind of contact implantation using an electrostatic chuck.

The process of the present invention has been tried experimentally. No electrostatic defects have been detected using the process of the present invention. Experiments have shown no difference in I/O leakage or in reliability performance of the implanted region.

The process of the invention provides an effective method of preventing electrostatic discharge damage, or the arcing effect, when performing a contact implantation using an electrostatic chuck. A conductive layer is deposited within the contact opening before the contact implantation. The conductive layer prevents charges from accumulating thereby preventing the arcing effect. Yield improvements of 40–80% have been seen with the process of the present invention.

While the invention has been particularly shown and described with reference to the preferred embodiments thereof, it will be understood by those skilled in the art that various changes in form and details may be made without departing from the spirit and scope of the invention.

What is claimed is:
1. A method of fabricating an integrated circuit device comprising:
   providing a dielectric layer overlying a semiconductor substrate;
   etching into said dielectric layer to provide a contact opening through said dielectric layer to said semiconductor substrate;
   depositing a conducting layer overlying said dielectric layer and within said contact opening;
   forming a photoresist mask over said conducting layer having an opening above said contact opening;
   implanting ions into said semiconductor substrate through said conducting layer not covered by said photoresist mask wherein some of said ions are trapped on said photoresist mask and wherein said conducting layer conducts said ions trapped on said photoresist mask throughout said semiconductor substrate thereby preventing charge damage to said semiconductor substrate;
   removing said photoresist mask; and
   completing fabrication of said integrated circuit device.

2. The method according to claim 1 wherein said dielectric layer comprises silicon dioxide and has a thickness of between about 8000 and 12,000 Angstroms.

3. The method according to claim 1 wherein said conducting layer comprises titanium and has a thickness of between about 300 and 2000 Angstroms.

4. The method according to claim 1 wherein said conducting layer comprises titanium/titanium nitride and has a thickness of between about 300 and 2000 Angstroms.

5. The method according to claim 1 wherein said step of implanting said ions is performed at an energy of between about 100 and 150 KeV.

6. The method according to claim 1 further comprising removing said conducting layer.

7. A method of performing a contact implantation in the fabrication of an integrated circuit device comprising:

provided a dielectric layer overlying a semiconductor substrate of a wafer;

etching into said dielectric layer to provide a contact opening through said dielectric layer to said semiconductor substrate;

depositing a conducting layer overlying said dielectric layer and within said contact opening;

forming a photoresist mask over said conducting layer having an opening above said contact opening;

placing said wafer in an ion implantation chamber wherein said wafer is held by means of an electrostatic chuck;

implanting ions into said semiconductor substrate through said conducting layer not covered by said photoresist mask wherein some of said ions are trapped on said photoresist mask and wherein said conducting layer conducts said ions trapped on said photoresist mask throughout said wafer thereby preventing charge damage to said dielectric layer;

removing said photoresist mask; and completing fabrication of said integrated circuit device.

8. The method according to claim 7 wherein said dielectric layer comprises silicon dioxide and has a thickness of between about 8000 and 12,000 Angstroms.

9. The method according to claim 7 wherein said conducting layer comprises titanium and has a thickness of between about 300 and 2000 Angstroms.

10. The method according to claim 7 wherein said conducting layer comprises titanium/titanium nitride and has a thickness of between about 300 and 2000 Angstroms.

11. The method according to claim 7 wherein said step of implanting said ions is performed at an energy of between about 100 and 150 KeV.

12. The method according to claim 7 further comprising removing said conducting layer.

13. A method of performing a contact implantation in the fabrication of an integrated circuit device comprising:

providing a dielectric layer overlying a semiconductor device structures formed in and on a semiconductor substrate of a wafer;

etching into said dielectric layer to provide a contact opening through said dielectric layer to said semiconductor substrate;

depositing a titanium layer overlying said dielectric layer and within said contact opening;

forming a photoresist mask over said titanium layer having an opening above said contact opening;

placing said wafer in an ion implantation chamber wherein said wafer is held by means of an electrostatic chuck;

implanting ions into said semiconductor substrate through said titanium layer not covered by said photoresist mask wherein some of said ions are trapped on said photoresist mask and wherein said titanium layer conducts said ions trapped on said photoresist mask throughout said wafer thereby preventing charge damage to said dielectric layer;

removing said photoresist mask; and completing fabrication of said integrated circuit device.

14. The method according to claim 13 wherein said dielectric layer comprises silicon dioxide and has a thickness of between about 8000 and 12,000 Angstroms.

15. The method according to claim 13 wherein said titanium layer comprises titanium and has a thickness of between about 300 and 2000 Angstroms.

16. The method according to claim 13 wherein said titanium layer comprises titanium/titanium nitride and has a thickness of between about 300 and 2000 Angstroms.

17. The method according to claim 13 wherein said step of implanting said ions is performed at an energy of between about 100 and 150 KeV.

18. The method according to claim 13 wherein said integrated circuit device is a CMOS logic device.

19. The method according to claim 13 further comprising removing said titanium layer.

* * * * *